United States Patent
Wyka et al.

[11] Patent Number: 6,166,509
[45] Date of Patent: Dec. 26, 2000

[54] DETECTION SYSTEM FOR SUBSTRATE CLAMP

[75] Inventors: Gary Wyka; Jaime Carrera, both of Austin; Van Hoskins, Round Rock, all of Tex.

[73] Assignee: Applied Materials, Inc., Santa Clara, Calif.

[21] Appl. No.: 09/349,001

[22] Filed: Jul. 7, 1999

[51] Int. Cl.[7] .................................................. G05B 1/06
[52] U.S. Cl. ...................... 318/640; 318/568.16; 414/936
[58] Field of Search ............................... 318/560, 568.12, 318/568.16, 640, 687; 414/936, 939, 941

[56] References Cited

U.S. PATENT DOCUMENTS

| | | | |
|---|---|---|---|
| 4,825,808 | 5/1989 | Takahashi et al. | 118/719 |
| 4,951,601 | 8/1990 | Maydan et al. | 118/719 |
| 5,186,718 | 2/1993 | Tepman et al. | 29/25.01 |
| 5,292,393 | 3/1994 | Maydan et al. | 156/345 |
| 5,483,138 | 1/1996 | Shmookler et al. | 318/568.16 |
| 5,563,798 | 10/1996 | Berken et al. | 364/478.06 |
| 5,740,062 | 4/1998 | Berken et al. | 364/478.06 |
| 5,838,121 | 11/1998 | Fairbairn et al. | 318/45 |
| 5,855,681 | 1/1999 | Maydan et al. | 118/719 |
| 5,882,165 | 3/1999 | Maydan et al. | 414/217 |
| 5,884,683 | 12/1998 | Pavloski et al. | 356/399 |
| 5,955,858 | 9/1999 | Kroeker et al. | 318/568.11 |
| 5,980,194 | 11/1999 | Freerks et al. | 414/754 |

Primary Examiner—Robert E. Nappi
Assistant Examiner—Rina I. Duda
Attorney, Agent, or Firm—Thomason, Moser & Patterson

[57] ABSTRACT

The present invention provides a method and apparatus for determining whether a substrate is in a clamped or unclamped state on a robot blade and preferably allows the position of a properly clamped substrate to be compensated for misalignments due to substrates not at or very near to their nominal positions on the blade. A sensor unit comprising a radiation source and a detector and capable of transmitting and receiving a signal is mounted outside a transfer chamber and is positioned to direct the signal therein. A robot blade having a reflecting member is actuated through the transfer chamber and into the path of the signal. The reflecting member is preferably positioned on a clamp finger and causes the signal to be reflected to the detector of the sensor unit when the signal is incident on the reflecting member. As the reflecting member moves through the signal the output of the sensor unit switches states, thereby generating values corresponding to the position of the reflecting member. Positional information may be derived from these values by comparison to predetermined, nominal positional information. The substrate is determined to be either unclamped, in which case the system is halted for operator intervention, or clamped. If the substrate is clamped, the derived positional information can be used to make adjustments for deviations from a nominal position due to variations in the diameter of the substrate.

26 Claims, 11 Drawing Sheets

DETECTION SYSTEM FOR SUBSTRATE CLAMP

BACKGROUND OF THE INVENTION

1. Field of the Invention

The present invention relates to a method and apparatus for detecting and adjusting the position of a substrate on a robot blade.

2. Background of the Related Art

A common configuration for processing equipment utilizes a number of different processing chambers accessible from a central chamber, known as a transfer chamber. Typically, transfer of a substrate between the various processing chambers is performed by a robot disposed in the transfer chamber. To accommodate the high throughput requirements of semiconductor processing, the robots are adapted for accurate, high-speed movement. The robot includes a substrate seating surface for supporting a substrate thereon and is capable of rotation and extension. Clamping mechanisms are typically used to secure the substrate to the substrate seating surface and prevent slippage which can result in damage.

Figure 1:
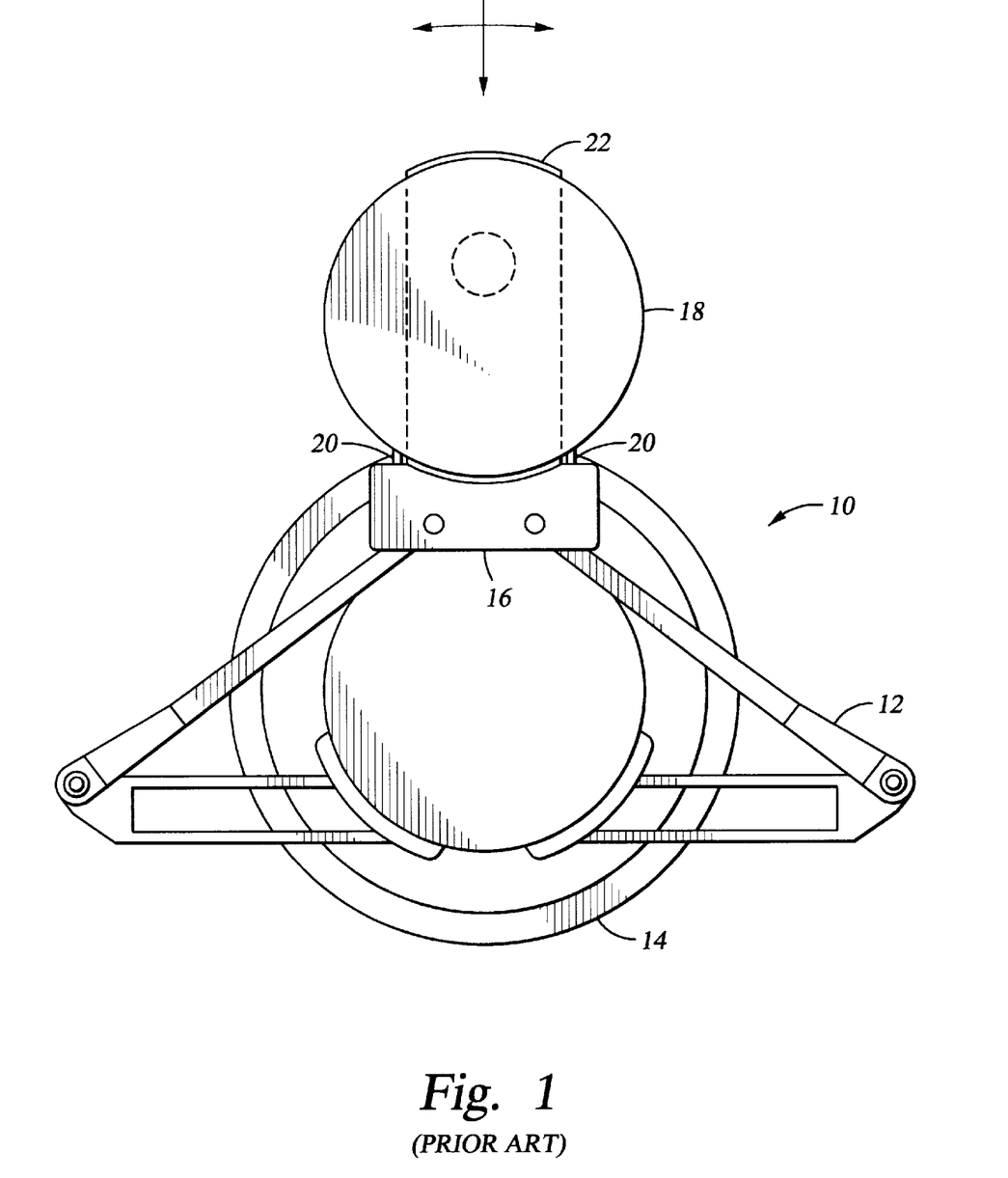
FIG. 1 is an exemplary frog-leg type stepper motor robot.
Figure 2:
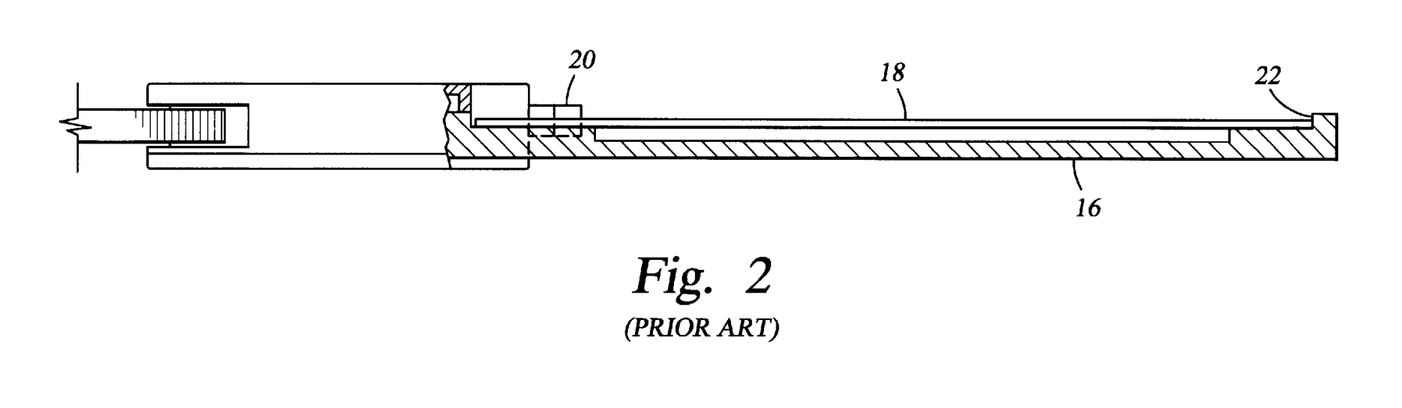
FIG. 2 is a side view showing a substrate properly positioned on a substrate support and secured by clamp fingers.

An exemplary frog-leg type robot 10 is shown in FIG. 1. The robot 10 comprises a four-bar linkage 12 mounted to a pair of central hubs 14 (only one shown) which may be actuated by stepper motors (not shown). A robot blade 16 connected to the linkage 12 is adapted to support a substrate 18 thereon. Clamp fingers 20 are provided to secure the substrate 18 during movement of the blade 16. In operation, the hubs 14 are rotated by the stepper motors to cause linear and rotational actuation of the robot blade 16. Rotation of the hubs 14 in the same direction causes rotation of the blade 16 while rotation of the hubs 14 in opposite directions causes extension and retraction of the blade 16. When a substrate 18 is disposed on the blade 16, the clamp fingers 20 are actuated toward the edge of the substrate 18 to urge the substrate 18 against a shoulder 22, or "shoe." Thus, the shoulder 22 and the clamp fingers 20 cooperate to hold the substrate 18 during movement of the robot 10. FIG. 2 shows a substrate 18 properly positioned between the shoulder 22 and the clamp fingers 20.

Figure 3:
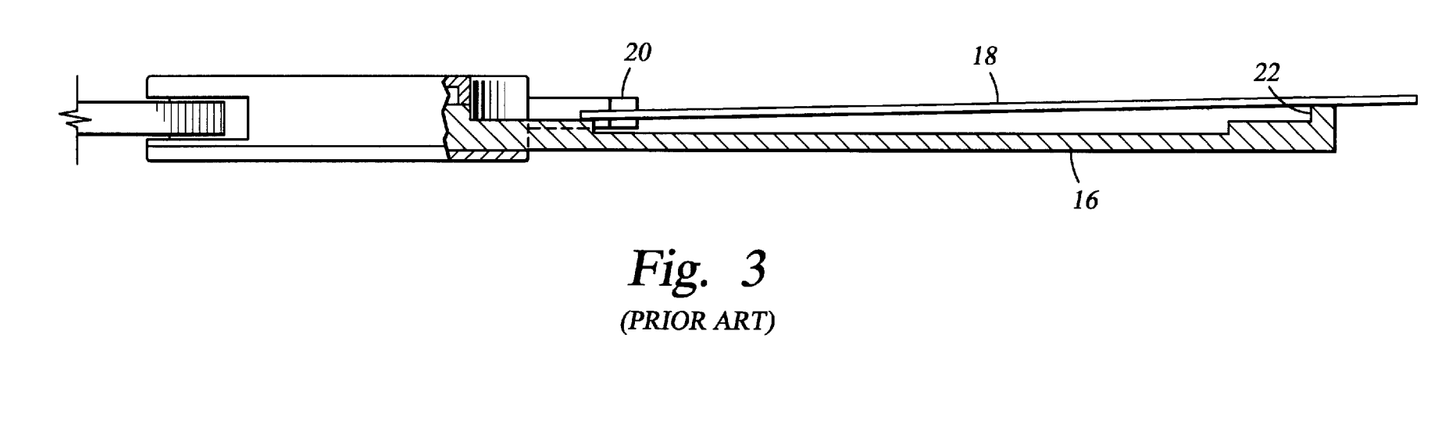
FIG. 3 is a side view showing a substrate improperly positioned on a substrate support and unsecured by clamp fingers.

Normally, stepper motor driven robots under computer control, such as the one shown in FIG. 1, are capable of repeatedly transporting substrates through a processing system with great speed and precision. However, the effectiveness of such substrate handling techniques can be greatly diminished if the initial position of the substrate is not known. For example, FIG. 3 shows a substrate 18 improperly positioned on the blade 16, wherein a portion of the substrate 18 is disposed on the shoulder 22. Such positioning of the substrate may occur during operation for various reasons. For example, the lift mechanism (lift pins) which deposits the substrate onto the blade may be improperly adjusted and vibrate, thereby causing the substrate to "walk" on the lift mechanism. Other causes include the effects of processing on the substrate due to gases delivered to the backside of the substrate and the plasma used during deposition of a material onto the substrate. Regardless of the cause for improper substrate positioning, upon actuation of the blade 16, an improperly positioned substrate 18 will likely slip from the blade 16 and be damaged. The likelihood of slippage is particularly great during rotation of the blade 16. Because current technology does not provide an accurate method of determining whether a substrate is securely clamped, substrates fall from the blade causing damage to the substrate, thereby requiring the system to be halted for operator intervention. The problems associated with unclamped substrates are heightened by use of increasingly faster robots.

Another problem associated with substrate transfer robots is the potential for misalignment of a properly clamped substrate in a chamber. In semiconductor processing, it is desirable to know the exact location of a substrate relative to the robot blade so that the substrate can be precisely positioned at an optimum location at a final destination such as within a processing chamber. Knowledge of the substrate position allows repeatably positioning substrates in a chamber at substantially the same location, thereby maximizing the effectiveness of the processing onto the desired surface area of the substrate to be processed. Ideally, clamped substrates being transferred by the robot are situated at the substrate's nominal position within the pocket of the blade. In practice, however, substrates are not always disposed at or substantially near the nominal position causing the robot to deposit the substrate in the chamber at a position displaced from the intended destination. Therefore, current methods utilize centerfinding techniques to determine the centerpoint of each substrate and position the substrate accordingly, thereby ensuring that each substrate is positioned uniformly relative to the known centerpoints.

While methods for substrate centerfinding are known, current technology does not provide a method or apparatus for detecting the clamped or unclamped state of a substrate as well as allow for corrections in substrate positioning to ensure proper alignment in a process chamber. Further, known methods of centerfinding have several disadvantages resulting in reduced throughput and increased complexity and cost. For example, one known method comprises a bank of sensors and detectors disposed inside the vacuum environment of a processing system. A substrate is moved into the optical paths of the signals emitted by the sensors, thereby blocking the signals. Once the signals become blocked the output of the detectors switches states. The change in the output of the detectors is then used to calculate the center of the substrate. The requirement of multiple sensors is a disadvantage because of the cost and increased complexity of the system. Typically, such an arrangement is feasible only at one location in the processing system requiring substrates to be transported to the location of the bank of sensors each time centerfinding is to be performed, thereby limiting throughput. Further, by positioning the sensors inside the vacuum environment the sensors can outgas particles leading to contamination of the substrates. Thus, it would be preferable to perform the centerfinding on-the-fly, i.e., during the normal operating sequences of a robot in order to minimize the impact on throughput. It would also be preferable to limit the number of electronic sensing components and to position the components outside the vacuum environment of the processing chamber.

Other centerfinding techniques utilize a spindle type apparatus whereby the substrate is transferred to a spindle assembly and incrementally rotated to determine the centerpoint offset by geometric analysis. Such an arrangement is undesirable because the apparatus is separate and distinct from the processing system, thereby requiring additional steps and costs to the manufacturing process and inhibiting productivity.

Therefore, there is a need for an apparatus and method to determine the clamped or unclamped state of a substrate on a robot support member as well as allow for necessary corrections in the position of the substrate in a process chamber. Preferably the apparatus is positioned outside a vacuum environment of a processing chamber and is adapted to operate on-the-fly.

SUMMARY OF THE INVENTION

The present invention generally provides a method and apparatus for deriving positional information about a substrate disposed on a robot blade. Initially, a determination is made whether a substrate is in a clamped or unclamped state on a robot blade. If the substrate is properly clamped, the center of the substrate is determined so that any misalignment of the center relative to a nominal position on the blade may be corrected.

In one aspect of the invention, a sensor unit, preferably comprising a radiation source and a detector and capable of transmitting and receiving a signal, is positioned to direct a signal along an optical path intersecting a substrate path. A substrate support member having a reflecting member disposed thereon is positionable in the optical path of the signal by a robot. The reflecting member is preferably positioned on a clamp finger and is adapted to reflect a portion of the signal back to the detector of the sensor unit when the signal is incident on the reflecting member.

In another aspect of the invention, a sensor unit is disposed in a region external to a transfer chamber and is positioned to transmit a signal therein. The sensor unit preferably comprises a radiation source to emit the signal and a detector to receive a reflected portion of the signal. In one embodiment, the radiation source and the detector are separate components. The transfer chamber includes a chamber body and a lid having viewports formed therein and is in communication with one or more adjacent chambers via a vacuum sealable opening. A robot disposed in an enclosure defined by the transfer chamber comprises a support member having a blade to support a substrate thereon. The support member includes one or more clamp fingers adapted to secure the substrate to the blade during transfer through the transfer chamber. A reflecting member is disposed on at least one of the clamp fingers and is positionable in the path of the signal to reflect a portion thereof to the detector. The position of the one or more clamping fingers, and thus the reflecting member, is determined by the position of a substrate disposed on the support member. If the substrate is properly clamped the one or more clamp fingers and reflecting members are in a first position, whereas if the substrate is improperly clamped the one or more clamp fingers and reflecting member are in a second position. The first and second positions are detected by the sensor unit and compared to calibrated values to determine the position of the substrate.

In yet another aspect of the invention, a method for detecting whether a substrate disposed on a support member is clamped or unclamped on a support member by at least one clamp finger movably connected to the support member is provided. Initially, a substrate is positioned on the support member and secured by actuating the clamp finger toward the substrate. The support member is actuated by a robot motor to position a reflecting member disposed on one of the clamp fingers into a signal path to reflect a portion of the signal. The reflected portion of the signal is detected and causes an output of the detector to switch from a first state to a second state. The change in output states is associated with an actual positional value of the clamp finger and compared to a calibrated positional value to determine whether the substrate is clamped. Preferably, the actual and calibrated positional values of the clamp finger are derived from positional values of the robot motor.

In yet another aspect of the invention, a method for generating positional information about a substrate disposed on a support member is provided. Initially, a substrate is positioned on the support member and secured by actuating one or more clamp fingers toward the substrate. The support member is actuated by a robot motor to position a reflecting member disposed on one of the clamp fingers into a signal path to reflect a portion of the signal. The reflected portion of the signal is detected and causes an output of the detector to switch from a first state to a second state. The change in output states is associated with an actual positional value of the clamp finger and compared to a calibrated positional value to determine whether the substrate is clamped. Preferably, the actual and calibrated positional values of the clamp finger are derived from positional values of the robot motor. If the substrate is clamped, the center of the substrate can be determined by calculating a distance between the position of the clamp finger and the calibrated position of the clamp finger for a nominal substrate. The calculated distance may then be used to adjust a destination coordinate of the substrate to ensure proper alignment of the substrate at a subsequent destination.

In still another aspect of the invention, a method is provided for determining positional information about a substrate disposed on a blade actuated by a robot located in a transfer chamber. The method determines whether a substrate disposed on a blade is clamped or unclamped by at least one clamp finger movably connected to the blade. A signal is transmitted from a region exterior to the transfer chamber into an enclosure defined by the transfer chamber. A substrate is positioned on the blade and one or more clamp fingers are actuated toward the substrate. The blade is actuated by the robot to cause linear movement of the blade along a transfer plane. During the linear movement of the blade, a reflecting member disposed on one of the clamp fingers intercepts the signal to reflect a portion thereof. The reflected portion of the signal is detected and causes an output of the detector to switch from a first state to a second state. The change in output states is associated with an actual positional value of the clamp finger and then compared to a calibrated positional value to determine whether the substrate is clamped. Preferably, the actual and calibrated positional values of the clamp finger are derived from positional values of the robot motor. If the substrate is clamped, the center of the substrate can be determined by calculating a distance between the position of the clamp finger and the calibrated position of the clamp finger for a nominal substrate. The calculated distance may then be used to adjust a destination coordinate of the substrate to ensure proper alignment of the substrate at a subsequent destination, thereby compensating for any deviations from the nominal substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a method and apparatus for deriving positional information about a substrate disposed on a robot blade. Initially, a determination is made whether a substrate is in a clamped or unclamped state on the robot blade. If the substrate is properly clamped, the center of the substrate is determined so that any misalignment of the center relative to a nominal position on the blade may be corrected. A sensor unit, preferably comprising a radiation source and a detector and capable of transmitting and receiving a signal, is mounted outside a transfer chamber and is positioned to direct the signal therein. A substrate support member having a reflecting member is actuated through the transfer chamber and into the path of the signal. The reflecting member is preferably positioned on a clamp finger and causes the signal to be reflected to the detector of a sensor unit when the signal is incident on the reflecting member. As the reflecting member moves through the signal, the output of the sensor unit switches states, thereby generating values corresponding to the position of the reflecting member. The resulting values are compared to predetermined, nominal values to derive positional information pertaining to a substrate disposed on the support member. The substrate is determined to be either unclamped, in which case the system is halted for operator intervention, or clamped. If the substrate is clamped, the derived positional information can be used to make adjustments for deviations from a nominal position due to variations in the diameter of the substrate.

Figure 4:
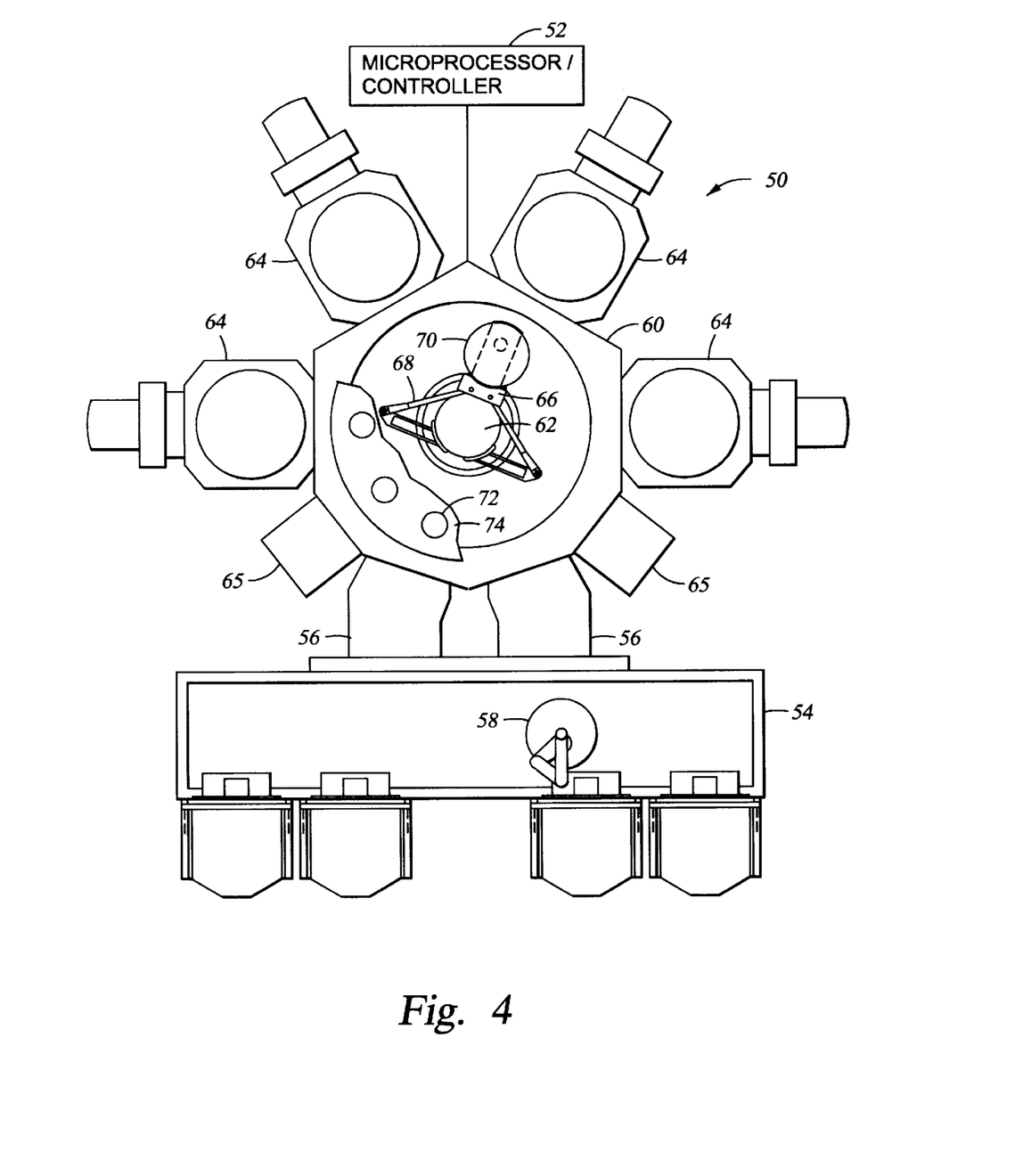
FIG. 4 is a top view of a processing system 50 of the present invention.

FIG. 4 is a top view of a processing system 50 of the present invention. A portion of the lid 74 has been cut away to reveal details of the processing system 50. The processing system 50 is typically known as a cluster tool. Two such systems are the Centura® and the Endura® both available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. The exact arrangement and combination of the chambers may be altered for purposes of performing specific steps of a fabrication process.

In accordance with the present invention, the processing system 50 generally comprises a plurality of chambers and robots and is preferably equipped with a microprocessor/controller 52 programmed to control the various processing methods performed in the processing system 50. A front-end environment 54 is shown positioned in selective communication with a pair of load lock chambers 56. A pod loader 58 disposed in the front-end environment 54 is capable of linear and rotational movement to shuttle cassettes of substrates to and from the load locks 56. The load locks 56 provide a first vacuum interface between the front-end environment 54 and a transfer chamber 60. A robot 62 is centrally disposed in the transfer chamber 60 to transfer substrates from the load locks 56 to one of the various processing chambers 64 and service chambers 65. The robot 62 is a frog-leg type robot capable of extension, retraction, and rotation and is actuated by a stepper motor. A support member 66 connected to the robot linkage 68 is adapted to support a substrate 70 during transfer through the transfer chamber 60 and between the chambers 64, 65 and the load locks 56. The processing chambers 64 may perform any number of processes such as physical vapor deposition, chemical vapor deposition, electroplating and etching while the service chambers 65 are adapted for degassing, orientation, cooldown and the like. A number of view ports 72 formed in a lid 74 of the transfer chamber 60 provide visual access into the transfer chamber 60.

While the invention has application in any arrangement requiring the determination of substrate positional information, processing systems such as the one shown in FIG. 4 are particularly well-suited because of the volume of traffic accommodated by the transfer chamber 60 and because of the view ports 72 which provide a line-of-sight into the transfer chamber 60. As will be described below, the view ports can accommodate a signal from a source positioned externally to the vacuum environment of the transfer chamber 60. It is understood that other applications of the invention are contemplated.

Figure 5:
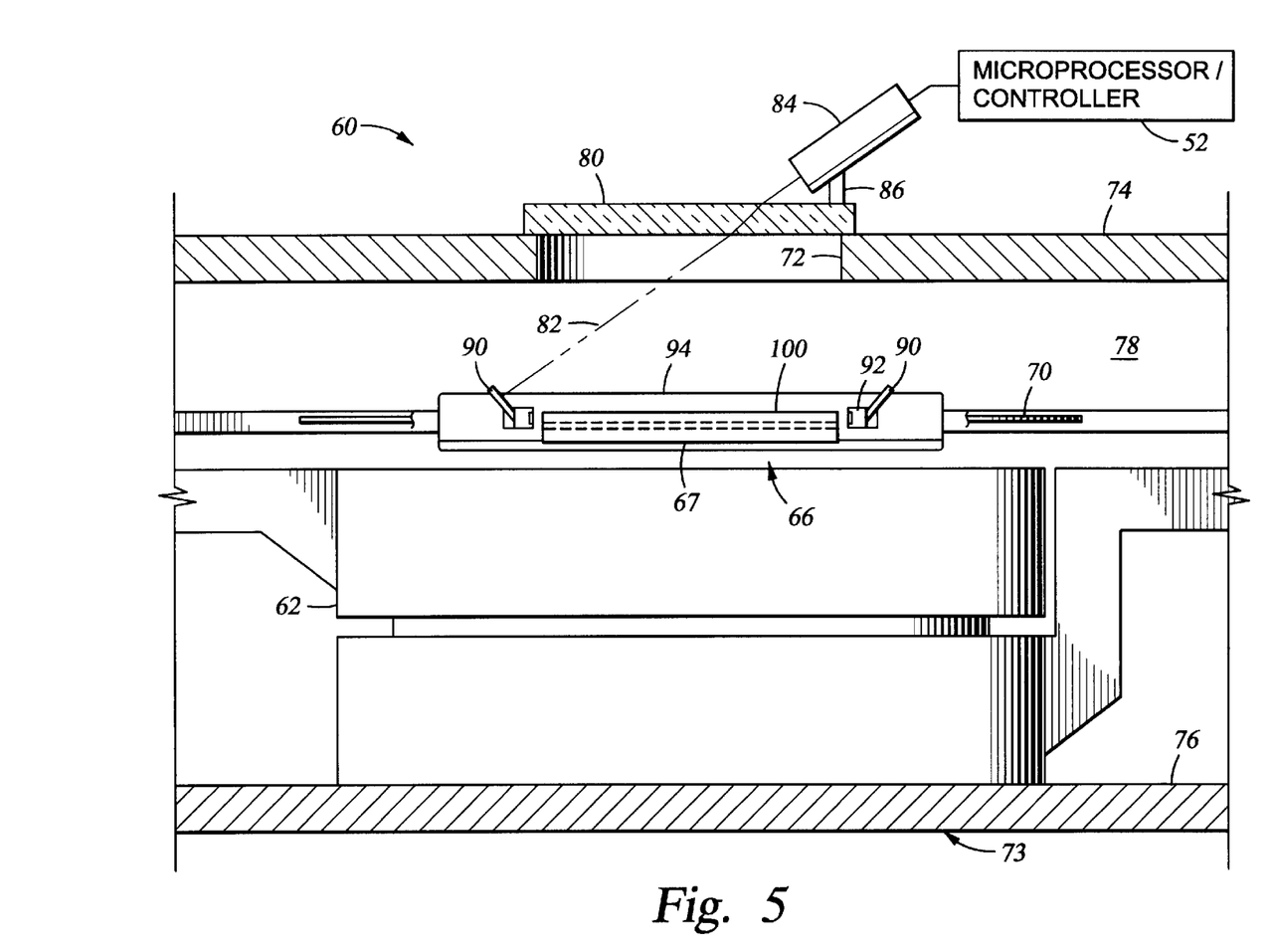
FIG. 5 is a partial cross sectional front view of a transfer chamber and a process chamber of the processing system of FIG. 4 showing the support member supporting a substrate.
Figure 6:
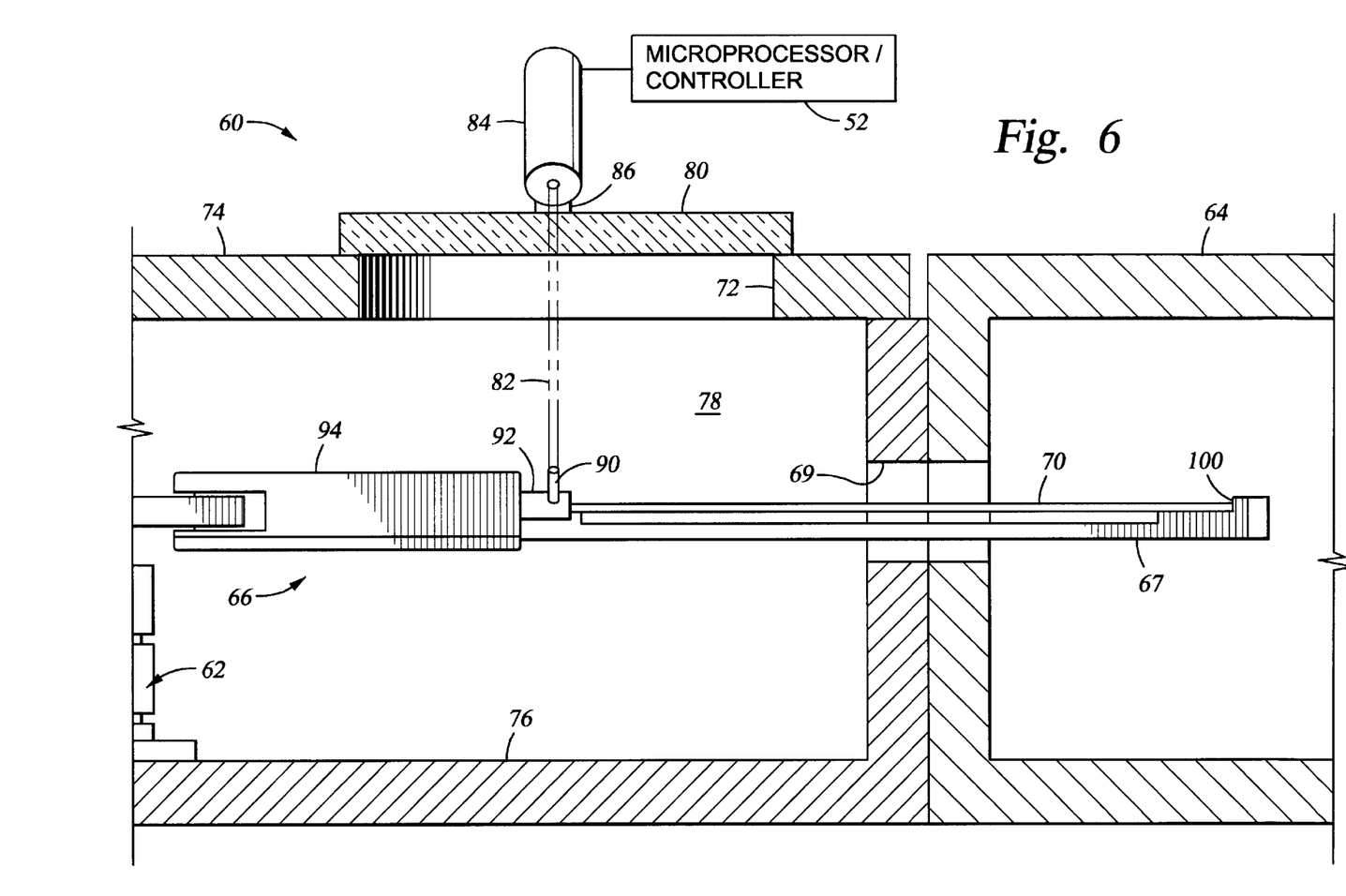
FIG. 6 is a side view of FIG. 5.

FIGS. 5 and 6 are partial cross sectional front and side views, respectively, of the transfer chamber 60 and a process chamber 64 of the processing system 50 (shown in FIG. 4) showing the support member 66 supporting a substrate 70. The transfer chamber 60 and the process chamber 64 are in communication with one another through a vacuum sealable opening 69 which can be selectively closed by a gate valve (not shown) or similar device. The transfer chamber 60 is defined by a body 73 and the lid 74 disposed thereon to form an enclosure 78. A radiation transparent plate 80 is disposed in the view port 72 to allow transmission of a signal 82 into the enclosure 78. The transparent plate 80 is preferably made of quartz but may also be made of Pyrex™, sapphire or other radiation transparent material which can accommodate a desired operating wavelength.

A sensor unit 84 is disposed outside the transfer chamber 60 and is positioned to direct a signal 82 into the enclosure 78 through the transparent plate 80. Preferably, the sensor unit 84 is mounted to the transparent plate 80 by a bracket 86 that allows for alignment adjustments and is positioned externally to the enclosure 78. While positioning the sensor unit 84 external to the enclosure 78 facilitates easy access to the sensor unit 84, the invention also contemplates positioning the sensor unit 84 inside the enclosure 78. The sensor unit 84 preferably includes both a radiation source for generating the signal 82 and a detector for receiving and detecting a reflected portion of the signal 82. Although the radiation source and the detector are preferably components of a single sensor unit 84 as shown in FIGS. 5 and 6, the radiation source and the detector may also be separate components. One sensor unit 84 which may be used to advantage is the PicoDot™ convergent laser sensor, having an operating wavelength 670 nm, model number PD45VN6C100, available from Banner Engineering Corporation of Minneapolis, Minn. In operation, the output of the sensor unit 84 switches between at least a first state and a second state, depending on whether the reflected portion of the signal 82 is detected or not. The output is in a first state when no reflected portion of the signal 82 is detected. The output is in a second state when a reflected portion of the signal 82 is received and detected by the sensor unit 84. A microprocessor/controller 52 is coupled to the sensor unit 84 to receive electrical transmissions corresponding to the output of the sensor unit 84 and uses the transmissions to generate positional information about a substrate disposed on the support member 66. The microprocessor/controller 52 is also preferably coupled to the processing system 50 to operate the components thereof, as described with reference FIG. 4.

Reflection of the signal 82 back toward the sensor unit 84 during operation is accomplished by positioning a reflecting member 90 in the path of the signal 82, as shown in FIGS. 5 and 6 (two reflecting members 90 are shown, one on each clamp finger 92). Preferably, the reflecting member 90 is fixedly attached to a clamp finger 92 and, in one embodiment, may be an integral component thereof. Thus, the positioning of the reflecting member 90 relative to the support member 66 is determined by the position of the clamp finger 92 which is movably disposed in a wrist housing 94 of the support member 66. The reflecting member 90 may comprise any reflective material which does not completely absorb the signal 82. Thus, in one embodiment the reflecting member 90 is made of aluminum. Preferably, the reflecting member 90 is cylindrical but more generally may be any geometric shape adapted to reflect a portion of the signal 82 back to the sensor unit 84. For example, the reflecting member 90 may include a planar surface at an upper end of the reflecting member 90 oriented perpendicularly relative to the signal 82 in order to cause reflection of the signal 82 when the reflecting member 90 is positioned in the path of the signal 82. In another embodiment, the reflecting member 90 may be a polished surface formed on a clamp finger 92 itself and oriented to reflect the signal 82 to the sensor unit 84.

Figure 7:
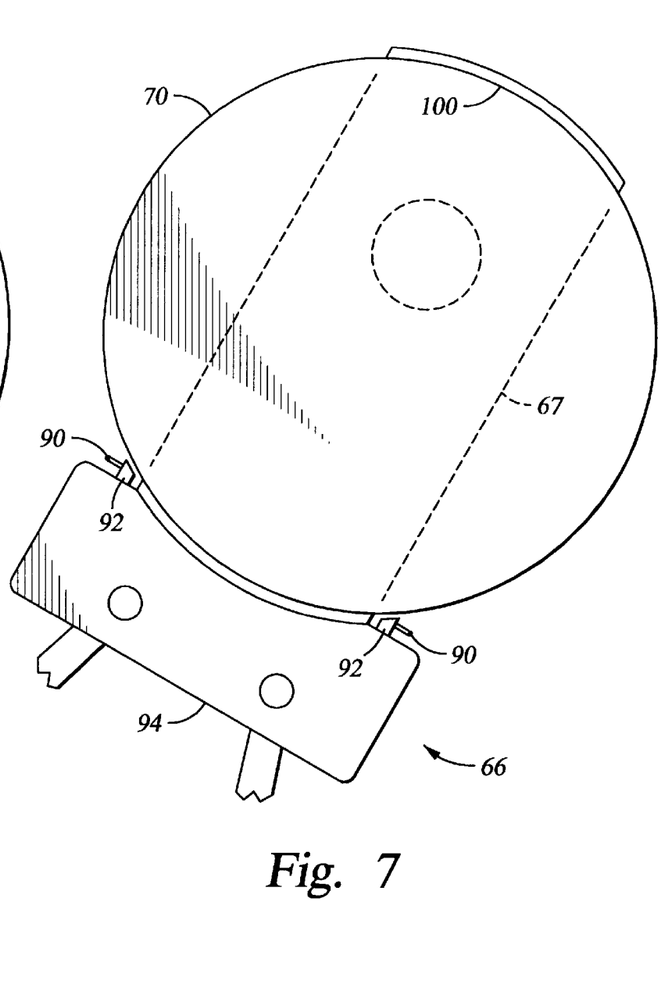
FIG. 7 is a top view of a support member having a substrate disposed thereon and having clamp fingers in a fully retracted position.
Figure 8:
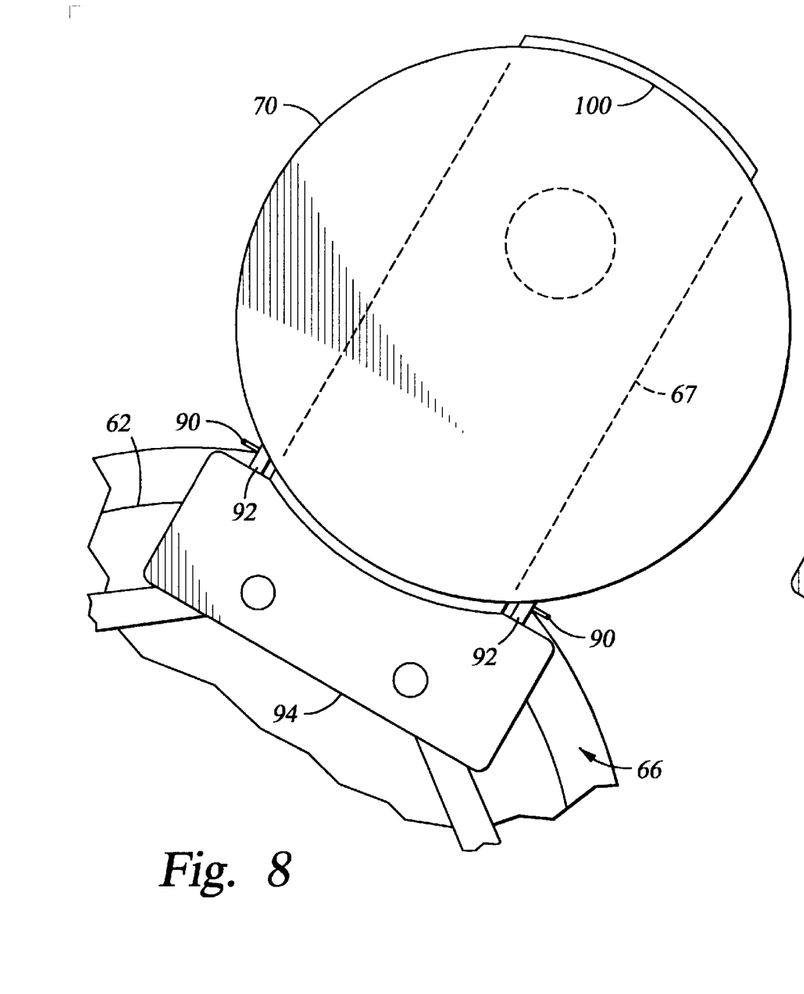
FIG. 8 is a top view of a support member having a substrate disposed thereon and having clamp fingers in a fully extended position.

The structure and operation of the support member 66, clamp fingers 92, and reflecting member 90 can be illustrated with reference to FIGS. 6–10 which illustrate the clamp fingers 92 in extended and retracted positions. Referring first to FIGS. 6 and 8, a side view and a top view of the support member 66 having a substrate 70 disposed thereon are shown. The support member 66 comprises a blade 67 connected to the wrist housing 94 at an initial end and having a shoulder 100, or shoe, at a terminal end. Clamp fingers 92 extend from the wrist housing 94 outwardly toward the shoulder 100 and cooperate with the shoulder 100 to define a pocket for accommodating substrates of a known diameter. Although preferably two clamp fingers 92 are provided, the number and design of the clamp fingers 92 is not considered limiting of the present invention. The actuation of the clamp fingers 92 may be achieved by a clamping mechanism (not shown) located in the wrist housing 94 which may include various camming members and biasing members such as extension springs and leaf springs as are known in the art. The clamping mechanism is constructed to move the clamp fingers outwardly of the wrist housing 94 and toward the shoulder 100 until reaching a fully extended terminal position. The degree of extension of the clamp fingers 92 for a substrate of a particular diameter depends on whether the substrate is properly clamped. When a substrate is properly positioned in the pocket of the blade 67 the clamp fingers 92 abut the edge of the substrate and are prevented from reaching their fully extended position because of the opposing force provided by the substrate. When, however, the substrate is improperly positioned, such as when a portion of the substrate is disposed on the shoulder 100, i.e., "out of pocket," the clamp fingers 92 continue moving forward, thereby pushing the substrate further out of pocket, until reaching a fully extended position because no counteractive force is provided by the substrate. Thus, when the substrate is properly seated in the pocket of the blade 67, the clamp fingers 92 terminate at a first position short of the fully extended position, while when the substrate is improperly positioned, the clamp fingers 92 terminate at a second position, i.e., a fully extended position.

In operation, the clamp fingers 92 are selectively actuated into and out of the wrist housing 94. In an extended position, shown in FIGS. 6 and 8, the clamp fingers 92 contact the edge of the substrate 70 and urge the substrate 70 against the shoulder 100. The clamp fingers 92 supply sufficient force to secure the substrate 70 during the rotational and translational movement of the support member 66. In a retracted position, shown in FIG. 7, the clamp fingers 92 are pulled partially into the wrist housing 94, thereby providing a sufficient distance between the clamp finger tips and the shoulder 100 to allow removal of a substrate from, or positioning a substrate on, the blade 67.

Figure 9:
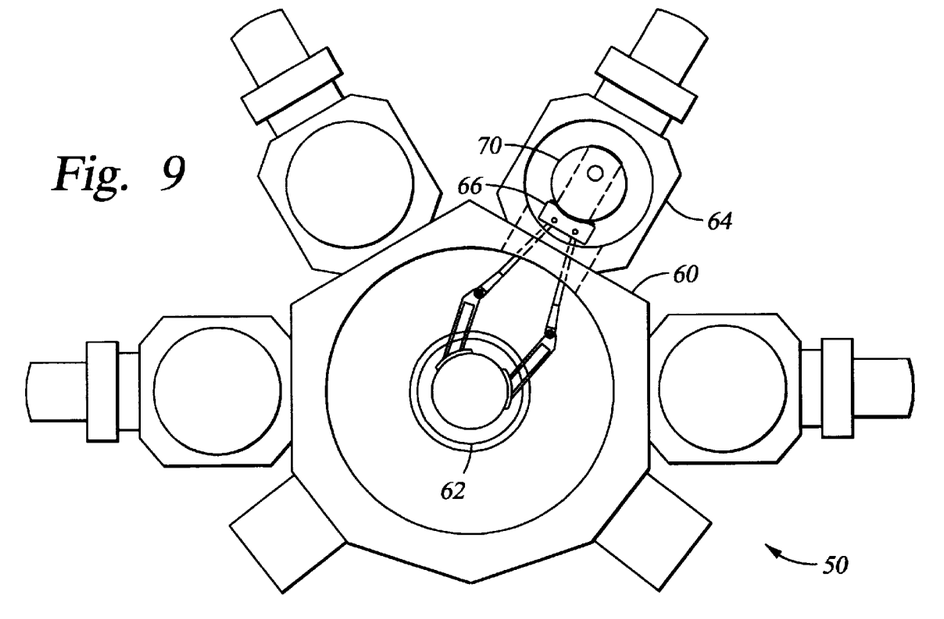
FIG. 9 is a partial top view of the processing system of FIG. 4 showing the support member fully extended into a process chamber.
Figure 10:
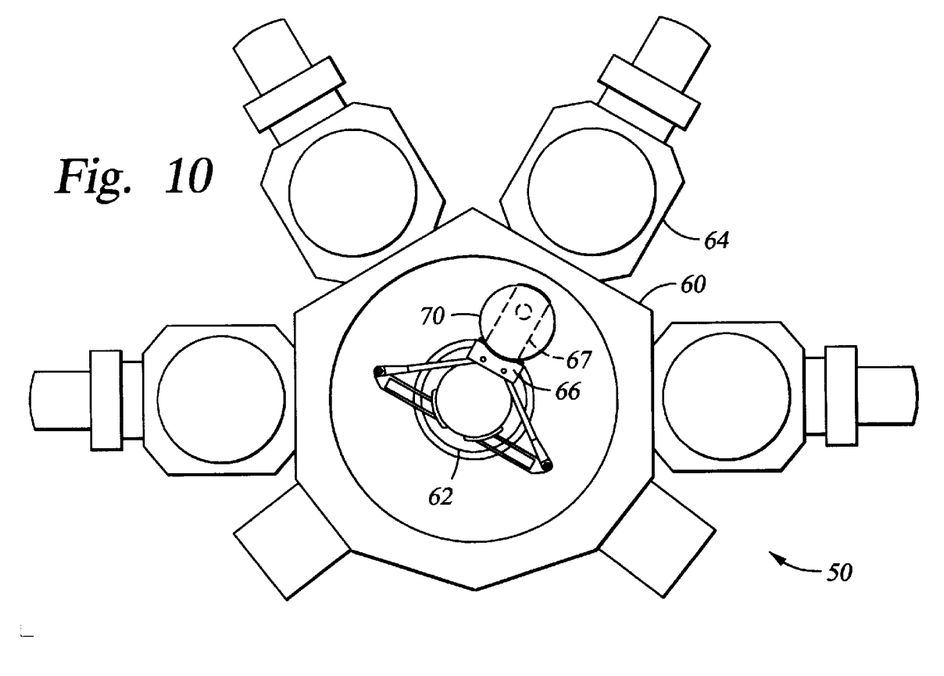
FIG. 10 is a partial top view of the processing system of FIG. 4 showing the support member fully retracted in a transfer chamber.

In general, extension and retraction of the clamp fingers 92 is achieved by the linear movement of the support member 66. When the support member 66 is extended, the clamp fingers 92 are retracted to allow transfer of a substrate from or onto the blade 67. For example, FIG. 9 is a partial top view of the processing system 50 showing the support member 66 fully extended into a process chamber 64 for pick-up or delivery of the substrate 70. In such a position, the clamp fingers 92 are fully retracted as shown in FIG. 7. Preferably, the clamp fingers 92 are designed to remain clamped until the latter-most portion of the extension stroke, so that a substrate supported by the support member 66 remains securely fastened until immediately prior to the termination of the stroke. Conversely, the clamp fingers 92 are moved into an extended position during retraction of the support member 66 into the transfer chamber 60. Thus, FIG. 10 shows the support member 66 fully retracted, in which position the clamp fingers 92 are fully extended (as show in FIG. 8). The extended position of the clamp fingers 92 secures the substrate 70 and allows high-speed rotation without causing damage to the substrate 70 as a result of falling from the support member 66.

During normal operation, a substrate being rotated through the transfer chamber 60 is secured on the blade 67 by the extended clamp fingers 92, thereby preventing damage to the substrate. However, as described above with reference to FIG. 3, occasionally a substrate is improperly positioned on the blade 67 and, as a result, is not in a clamped state. The substrate positioning system in accordance with the present invention may be used to determine the state of a substrate prior to movement which may cause the substrate to fall from the blade resulting in damage to the substrate and requiring the system to be halted for operator intervention. Preferably, the clamped or unclamped state of a substrate is determined immediately prior to each time a substrate is rotated through the transfer chamber 60, such as when a substrate is removed from a process chamber or load lock and is shuttled to a subsequent location. The clamp/unclamped state of a substrate is determined by changes in the output of the sensor unit 84. When the stepper motor of the robot 62 advances the substrate so that the reflecting member 90 crosses the path of the signal 82 of the sensor unit 84, the output of the sensor unit 84 changes state. That is, the output of the sensor unit 84 changes indicating that the signal 82 is either reflected or not reflected. Thus, preferably, the output of the position sensor switches between two states, one of which corresponds to a reflected signal and a second that corresponds to an unreflected signal.

Figure 11:
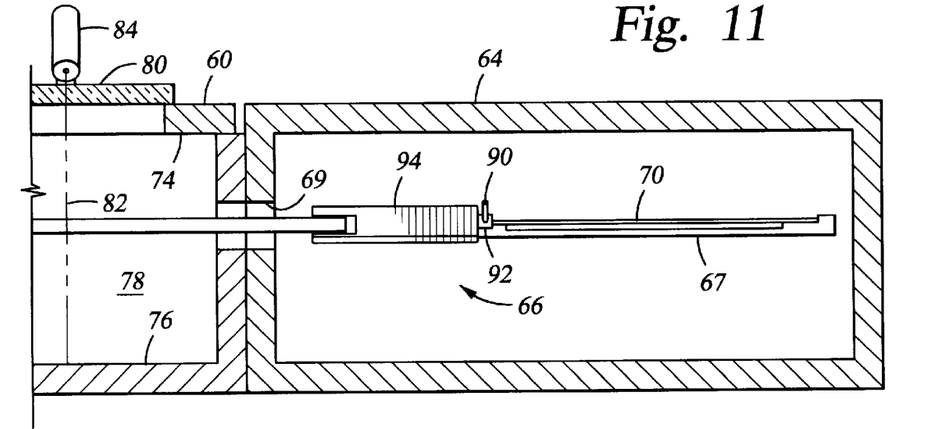
FIGS. 11–13 are side views showing a support member in a series of consecutive positions during retraction from a process chamber in a transfer chamber.

The operation of the invention will be described in reference to FIGS. 11–13, which are side views of the support member 66 in various positions relative to a process chamber 64 and the transfer chamber 60. FIG. 11 shows the support member 66 fully extended into the process chamber 64 with the clamp fingers 92 fully retracted and not in contact with the substrate 70 supported on the blade 67. The signal 82 is shown propagating uninterrupted toward the floor 76 of the transfer chamber 60. Under such conditions, where no reflected portion of the signal 82 is detected, the output of the sensor unit 84 is at a first state. The effects of background radiation due to other sources in the transfer chamber 60 as well as portions of the signal 82 reflected from various components other than the reflecting member 90 may be mitigated by any method known in the art. For example, the output of the sensor unit 84 is preferably only monitored during a window of time defined by the retraction of the support member 66 from the process chamber 64 into the transfer chamber 60. Further, because the expected values for the changes in the output state of the sensor unit 84 can be known within a range of certainty, all other values can be discarded.

Figure 12:
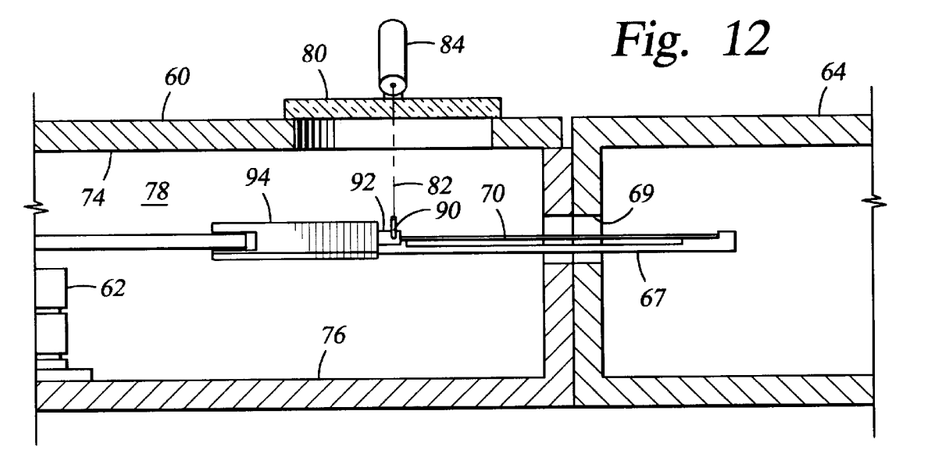
Figure 13:
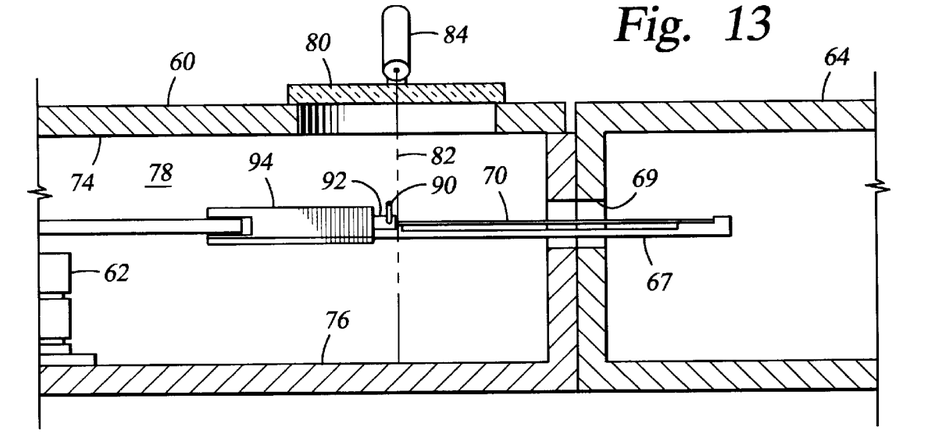

The support member 66 is then retracted through the vacuum sealable slit valve opening 69 formed between the process chamber 64 and the transfer chamber 60, as shown in FIG. 12. Preferably, the clamp fingers 92 are fully extended into contact with the substrate 70 as the support member 66 is moved through the opening 69 and before the support member 66 is fully retracted into the transfer chamber 60. During continued retraction of the support member 66, the reflecting member 90 is moved into the path of the signal 82 causing a portion of the signal 82 to be reflected back toward the sensor unit 84 and causing the sensor unit 84 to switch states upon detection of the reflected portion of the signal 82. The output of the sensor unit 84 is thus changed to a second state. As the reflecting member 90 moves past the path of the signal 82, as shown in FIG. 13, the output of the sensor unit 84 switches back to the first state. As described in greater detail below, the first and second states for each switch in the output of the sensor unit 84 can be associated with positional information pertaining to the clamp fingers 92.

In a preferred embodiment of the present invention, the outputs of the sensor unit 84 are monitored on a regular basis to determine if the sensor unit 84 has changed state in response to the most recent incremental displacement of the support member 66 caused by the robot 62. For example, the stepper motors of the robot 62 may be operated by the microprocessor/controller 52 that generates an interrupt for each step of the robot 62. The step interrupt generated by the linear translation of the stepper motor increments a counter with each step of the robot 62 and can be used to trigger a state check of the sensor unit 84 to determine whether the output of the sensor unit 84 has changed since the previous check. When the state check indicates that the state of the sensor unit 84 has changed, the microprocessor/controller 52 (shown in FIGS. 5–6) stores the encoder value of the stepper motor associated with the output change of the sensor unit 84. Thus, for the illustration described above with reference to FIGS. 11–13, two encoder values are captured and recorded. A first encoder value is recorded when the reflecting member 90 moves into the path of the signal 82 as shown in FIG. 12, and a second encoder value is recorded when the reflecting member 90 is moved out of the signal 82 path as shown in FIG. 13.

The encoder values associated with a state change in sensor unit 84 are then compared to calibrated encoder values obtained from a nominally sized substrate. The macroprocessor/controller 52 may, for example, compare the derived encoder values to the stored calibration values by means of a lookup table. A lookup table is generally preferred because of a nonlinear relationship between robot steps and distance associated with frog-leg type robots. Thus, the data from which the substrate clamped/unclamped state is calculated are encoder values of the robot recorded when the sensor unit 84 changes its state. If the recorded encoder values match the stored calibrated values for a nominal substrate, the substrate disposed on the support member 66 is assumed to be properly clamped, otherwise the substrate is considered to be unclamped and the system is halted for operator intervention.

Although in the foregoing illustration two encoder values are recorded, it is understood only one value is necessary to determine the position of the clamping finger 92 and reflecting member 90. Whether more than one value is recorded is dependent on the width of the clamp fingers 90 as well as the need to accommodate a range of substrate diameters for a given nominal size, as will be described in detail below. However, even when two encoder values are recorded, one may be discarded while the other is used to determine the position of the reflecting member.

The accuracy and repeatability of the present invention is determined primarily by the inherent tolerances of the robot 62, the sensor unit 84, and the clamping fingers 92. As referred to herein, repeatability is the ability of the invention to reproduce a result under similar conditions or stimuli, while accuracy is the degree of conformity between a measured value and the true value. For example, the robot 62 may be capable of repeatedly positioning the support member 66 within ±5 mils (five thousandths of an inch) of a particular position. Additionally, the sensor unit 84 and the clamp fingers 92 (more specifically the clamping mechanism which actuates the clamp fingers 92) are inherently limited in their repeatability. Each source of limited repeatability is a source of deviation and contributes to the total system error. The range of the total system deviation, or error, is defined as the pass/fail window, and acts as a limitation on the present invention to detect whether a substrate is unclamped. A reflecting member 90 position detected within the pass/fail window may be the result of an unclamped substrate or may be due to the deviation in the system repeatability, such as robot position repeatability. In order to differentiate between the deviation in the system repeatability and an unclamped substrate, the clamp fingers 92 are designed to purposely urge the unclamped substrate further out of pocket in order to reach a terminal position sufficient to move the reflecting member 90 a distance greater than the pass/fail window. If the reflecting member 90 is detected at a position outside the pass/fail window the substrate is determined to be unclamped. Thus, the pass/fail window is the minimal distance the substrate must be pushed out of pocket in order to be detected as unclamped. The pass/fail window may be minimized in various ways known to persons skilled in the art such as improving the repeatability of the robot 62, sensor unit 84, and clamping mechanism which actuates the clamp finger 92. While a perfect system is conceivable, i.e., a system with no sources of error or a system wherein the error is considered negligible, the following discussion assumes an imperfect system for illustrative purposes.

Figure 14A:
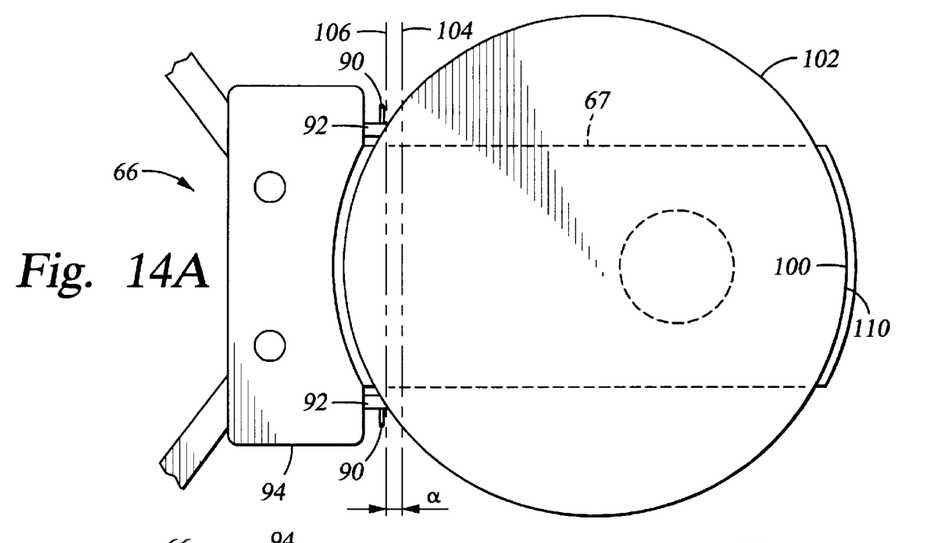
FIG. 14A is a top view of a support member having a properly clamped substrate disposed thereon and showing a pass/fail window.
Figure 14B:
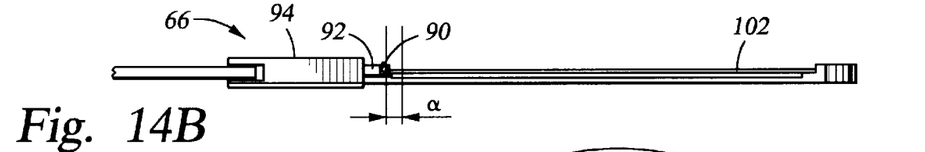
FIG. 14B is a side view of FIG. 14A.
Figure 15A:
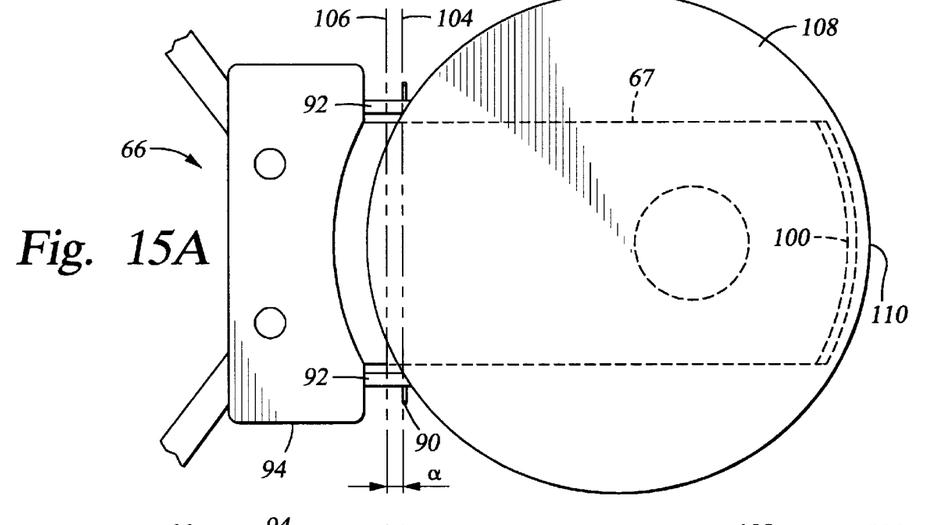
FIG. 15A is a top view of a support member having an unclamped substrate disposed thereon and showing a pass/fail window.
Figure 15B:
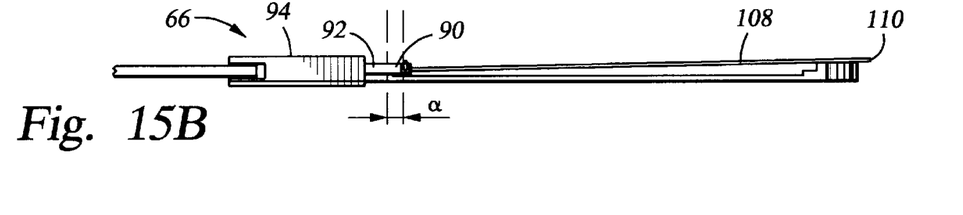
FIG. 15B is a side view of FIG. 15A.

The positioning of a substrate taking into account a pass/fail window can be illustrated with reference to FIGS. 14A–B and 15A–B which show partial top views and corresponding side views of a support member 66 and various positions for a substrate of the same size positioned on the support member 66. The support member 66 in FIGS. 14 and 15 is in a fully retracted position; thus, the encoder value for the robot 62 (shown in FIG. 4) is the same. A first position, shown in FIGS. 14A–B, shows the position of a clamped substrate 102 relative to a pass/fail window indicated by a distance $\alpha$. An upper limit 104 and a lower limit 106 delimit the pass/fail window. Although typically only a few mils, e.g., less than about 30 mils, $\alpha$ is shown greatly exaggerated here for clarity. A reflecting member 90 detected at any position backward (i.e., away from the shoulder 100) of the upper limit 104 of the pass/fail window, will be determined to be clamped. A second position, shown in FIGS. 15A–B, illustrates an unclamped substrate 108 which has been pushed out of pocket by the distance a to ensure detection of the unclamped state by the sensor unit 84 (shown in FIGS. 5–6). An unclamped substrate generally refers to a substrate which was not properly placed in the pocket of the blade 67 so that an edge of the substrate is not in abutment with the shoulder 100. Thus, FIGS. 15A–B show a distal edge 110 of the substrate 108 resting on the shoulder 100. Because no resistance is provided, the clamp fingers 92 continue to urge the substrate 108 forward until reaching a fully extended terminal position. Accommodating the deviation of the system repeatability, and the resulting pass/fail window, is accomplished by adjusting the terminal position of the clamp fingers 92, such that the difference in distance between the reflecting member 90 in the clamped state (FIGS. 14A–B) and the reflecting member 90 in the unclamped state (FIGS. 15A–B) is greater than $\alpha$. Thus, referring still to FIGS. 15A–B, the substrate 108 is shown in an unclamped state wherein the substrate 108 has been moved a distance greater than a out of pocket. In such a position, the sensor unit 84 (shown in FIGS. 5–6) and microprocessor/controller 52 (show in FIG. 4) will unambiguously determine that the substrate 108 is unclamped.

Although less likely, another unclamped state occurs when a portion of the substrate is disposed on wrist housing 94. In such a case, the reflecting member 90 will be obscured by the substrate and the output of the sensor unit 84 will not change during the actuation of the blade 67. Such an event is set by default to indicate an unclamped substrate.

Once a determination is made that a substrate is clamped, the robot 62 transfers the substrate to a predetermined destination. However, because substrate diameters may vary from a nominal substrate diameter, a positional correction is necessary to properly align the substrates at the final destination. Accordingly, for clamped substrates, the present invention is also capable of accommodating diameter variations from a nominal diameter which requires a correction in the positioning of the substrates at a drop-off point.

Adjustments for displacements in the center of a substrate due to variances in the substrate diameters from a nominal diameter require an initial determination that the substrate is properly clamped. Such a determination can be made in a manner similar to that described above with respect to FIGS. 11–13. However, an additional positional adjustment to the clamp fingers 92 and reflecting member 90 is required in order to differentiate between unclamped substrates and substrates having varying diameters within a known range.

Figure 16:
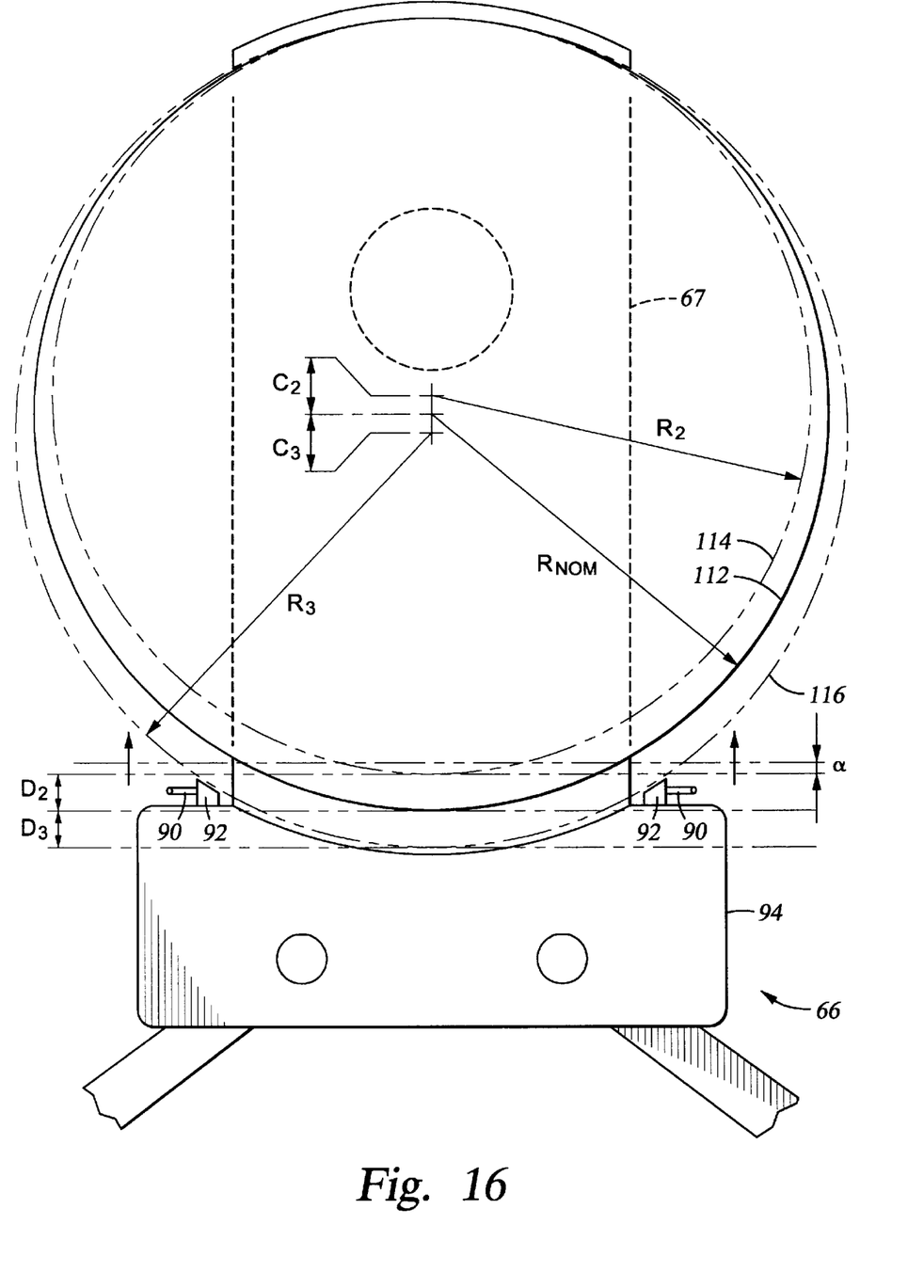
FIG. 16 is a top view of a support member illustrating the positions of various substrate sizes with respect to the support member and a pass/fail window.

FIG. 16 illustrates the differences in the position of the centers for two clamped substrates 114, 116 as compared to a nominally sized clamped substrate 112. An X indicates the center of each substrate and Rnom, R2, and R3 indicate the radii for a nominal first substrate 112, a second substrate 114 and a third substrate 116, respectively. The first substrate 112 shows the position of a nominal substrate, the second substrate 114 represents a minimum of the diameter deviation range, and the third substrate 116 represents a maximum of the diameter deviation range. The distance between the centers of the nominal first substrate 112 and the second substrate 114 is C2 and the distance between the centers of the first substrate 112 and the third substrate 116 is C3. Although typically only a few mils, e.g., less than about 40 mils, C2 and C3 are shown greatly exaggerated here for clarity. The centers are offset only along one linear direction shown by the arrows. Any initial lateral offset is corrected by the forward movement (shown by the arrows) of the clamp fingers 92. The pass/fail window, described above with reference to FIGS. 14–15, is also shown and is indicated by the distance $\alpha$. The terminal position of the clamp fingers 92 is adjusted to prevent a minimum diameter deviation, represented by the second substrate 114, from being detected as an unclamped substrate. Thus, to detect an unclamped substrate the clamp fingers 92 must be extended, as indicated by the arrows, at least a distance a plus a distance equal to the difference in diameters between the second substrate 114, representing the minimum diameter deviation, and the actual substrate disposed on the support member. For example, for a nominally sized substrate the clamp fingers 92 must be extended at least a distance $\alpha+D2$, wherein D2 represents the difference in diameters between the nominally sized substrate disposed on the support member 66 and the second substrate 114. For a substrate having a diameter equal to that of the third substrate 116 the clamp fingers 92 must be extended at least a distance $\alpha+D3$, wherein D3 represents the difference in diameters between the actual substrate disposed on the support member 66 and the second substrate 114. In summary, the smallest expected substrate and the pass/fail window determine the minimum clamp finger 92 extension required to differentiate between unclamped substrates and variation due to robot repeatability and substrate diameter variances.

Once a determination is made that the substrate is clamped, the center of the substrate may be calculated.

Preferably, the center is calculated by determining the encoder values for the actual substrate disposed on the support member 66, in a manner similar to that described above with reference to FIGS. 11–13, and comparing the encoder values against stored encoder values for a calibrated nominal substrate. The difference in the encoder values corresponds to a distance equaling the displacement distance of the actual center of the substrate on the blade 67 from the center of the calibrated nominal substrate. For example in FIG. 16, the displacement distances of the second and third substrates 114, 116 from the nominal center are C2 and C3, respectively. The displacement distance is then added or subtracted from the linear extension of blade 67 to result in the necessary destination coordinate correction. In operation, the microprocessor/controller 52 calculates the displacement distance and transmits a signal to the robot 62 instructing the robot 62 to position the blade 67 at the appropriate destination coordinate taking into account the displacement distance.

According to the foregoing embodiments of the invention, the inventors achieved an accuracy of about 5 to 7 mils in determining the substrate diameter and a total system repeatability of about 2 mils. Further, the inventors achieved substrate placement results at a destination coordinate of less than about 10 mils. However, it is understood that the present invention is not limited in scope by the degree of accuracy or repeatability and persons skilled in the art may obtain better results once the nature of the invention is understood as described above.

Figure 17:
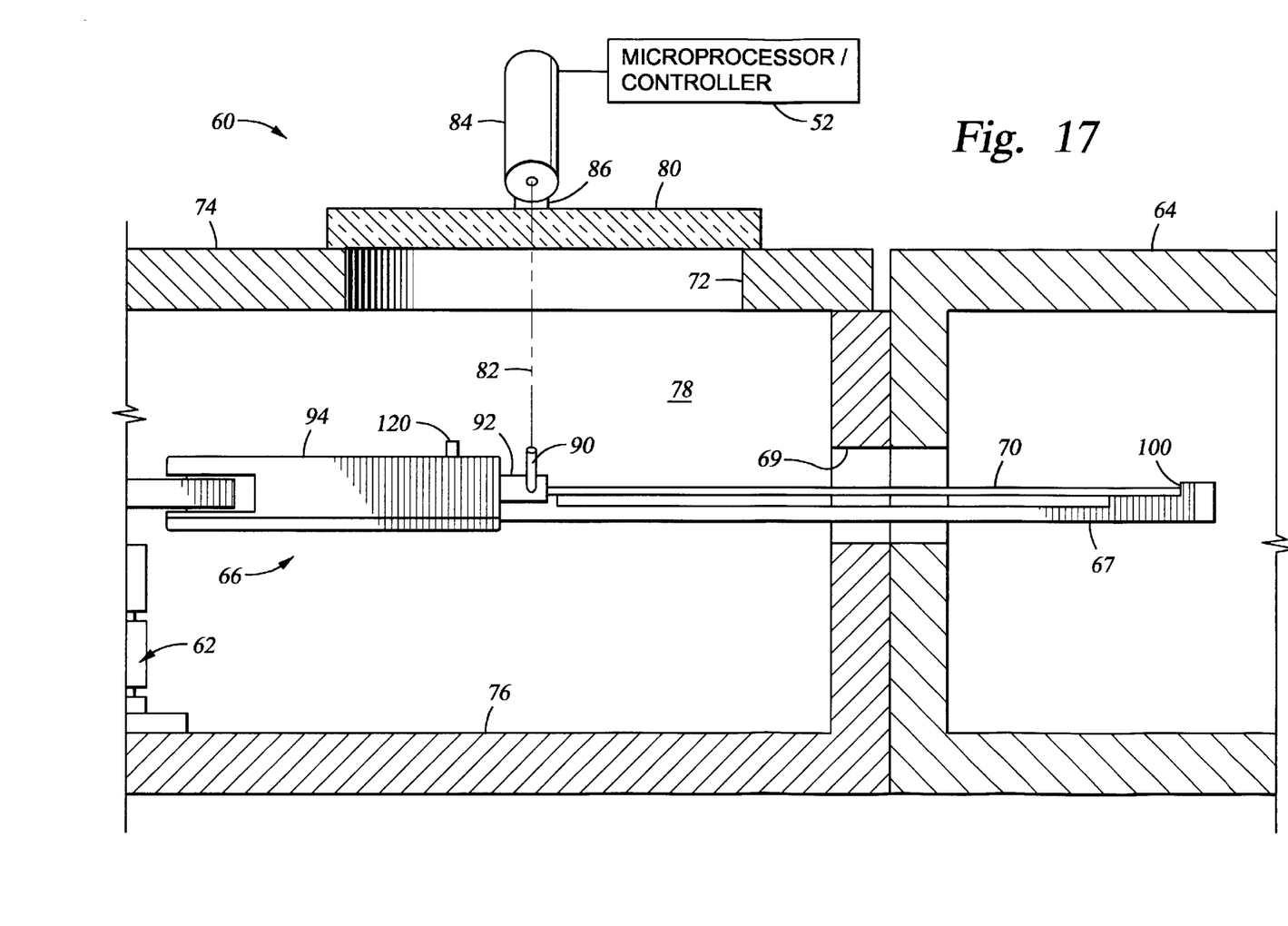
FIG. 17 is a partial cross sectional front view of the transfer chamber and the process chamber of the processing system of FIG. 4 showing another embodiment of the invention.

Further, the invention contemplates any number of variations and embodiments wherein the position of a clamp finger is determined. For example, in another embodiment, shown in FIG. 17, a reflecting member 120 may be positioned on the robot wrist housing 94 in addition to the reflecting member 90 positioned on the clamp finger 92. Each reflecting member 90, 120 is positioned to intercept the signal 82 during the movement of the blade 67. The position of the clamp finger 92 is then determined by calculating the distance between the reflecting members 90, 120 based on the recorded encoder values at the time of detection of each reflecting member 90, 120 in a manner similar to that described with reference to FIGS. 11–13. Such an arrangement is advantageous because it is "self calibrating." That is, the position of the robot 62 is not considered relevant because the critical measurement is the difference in distance between the reflecting members 90, 120. Thus, a comparison between derived encoder values recorded when the output of the sensor unit 84 switches states and the stored calibrated encoder values, as described above, is not necessary.

In still another embodiment, a reflecting member may be embedded in the shoulder 100 of the blade 67 and oriented to reflect a portion of the signal 82 back toward the sensor unit 84. Thus, a substrate "riding" the shoulder 100, such as is shown in FIGS. 15A–B, will obscure the reflecting member and prevent a portion of the signal 82 from being reflected. The absence of a detected signal is, by default, treated as an unclamped substrate. Such an arrangement may be used in tandem with one or more additional reflecting members positioned at various locations such as on a clamp finger 92, or may be used independently in a strictly "go/no-go" system capable of detecting an unclamped substrate but incapable of adjusting for variances in substrate diameters as was described with reference to FIG. 16.

Further, the construction of the clamping mechanism is not intended to be limiting of the invention. Thus, although the foregoing description relates to clamp fingers 92 adapted for linear extension and retraction relative to the wrist housing 94 (shown in FIG. 6), the invention contemplates other arrangement such as where the clamp fingers are rotationally actuated. Detection is facilitated by adjusting the terminal position of the clamp finger and/or the sensor unit as will be understood by those skilled in the art.

While foregoing is directed to the preferred embodiment of the present invention, other and further embodiments of the invention may be devised without departing from the basic scope thereof, and the scope thereof is determined by the claims that follow.

What is claimed is:

1. An apparatus comprising:
   (a) a chamber defining an enclosure;
   (b) a sensor unit positioned to transmit a signal in the enclosure and receive a reflected portion of the signal; and
   (c) a substrate support member movable through the enclosure, comprising:
      (i) a movable clamping member to secure a substrate positioned on the substrate support member; and
      (ii) a first reflecting member disposed on the movable clamping member and positionable in the signal.

2. The apparatus of claim 1, wherein the reflecting member comprises a cylindrical body.

3. The apparatus of claim 1, wherein the reflecting member comprises a metal having a reflective surface disposed in a normal relation to the signal.

4. The apparatus of claim 1, further comprising a second reflecting member disposed on the support member and in a fixed relation therewith, wherein the second reflecting member is movable into the path of the signal to cause reflection thereof.

5. The apparatus of claim 1, wherein the chamber comprises a body and a lid having a portion comprising a transparent material to accommodate the transmission of the signal therethrough.

6. The apparatus of claim 1, further comprising a computer coupled to the sensor unit to monitor an output signal produced by the sensor unit.

7. The apparatus of claim 1, wherein the support member comprises a shoulder at a terminal end of the support member and wherein the movable clamp member is adapted to engage an edge of the substrate and urge the substrate against the shoulder.

8. The apparatus of claim 1, wherein the sensor unit comprises a PicoDot™ laser source.

9. The apparatus of claim 1, wherein the sensor unit comprises a radiation source and a detector.

10. The apparatus of claim 9, wherein the radiation source comprises a laser source.

11. An apparatus comprising:
   (a) a transfer chamber defining an enclosure, comprising:
      (i) a chamber body having a vacuum sealable opening formed therein and sized to accommodate transfer of a substrate therethrough; and
      (ii) a lid disposed on the chamber body and having at a least a portion formed of a transparent material; and
   (b) a sensor unit disposed in a region external to the transfer chamber and positioned to transmit a signal into the enclosure and receive a reflected portion of the signal;
   (c) a robot disposed in the enclosure, comprising:
      (i) a substrate support member movable through the enclosure;

(ii) a clamping member connected to the substrate support member to secure a substrate positioned on the substrate support member; and (ii) a reflecting member disposed on the clamping member and positionable in the signal; and (d) at least one processing chamber disposed adjacent to the transfer chamber and in selective communication with the enclosure through the vacuum sealable opening.

12. The apparatus of claim 11, wherein the sensor unit comprises a PicoDot™ laser source.

13. The apparatus of claim 11, wherein the sensor unit comprises a radiation source and a detector.

14. The apparatus of claim 11, wherein the sensor unit comprises a laser source.

15. The apparatus of claim 11, wherein the reflecting member comprises a cylindrical body.

16. The apparatus of claim 11, wherein the reflecting member comprises a metal having a reflective surface disposed in a normal relation to the signal.

17. The apparatus of claim 11, further comprising a computer coupled to the sensor unit to monitor an output signal produced by the sensor unit.

18. The apparatus of claim 11, wherein the support member comprises a shoulder at a terminal end of the support member and wherein the clamping member is adapted to engage an edge of the substrate and urge the substrate against the shoulder.

19. The apparatus of claim 11, further comprising a second reflecting member disposed on the support member and in a fixed relation therewith, wherein the second reflecting member is movable into the path of the signal to cause reflection thereof.

20. A method for detecting whether a substrate disposed on a support member is clamped or unclamped by at least one clamp finger movably connected to the support member and having a first reflecting surface disposed thereon, the method comprising:

(a) positioning a substrate on the support member;

(b) actuating the clamp finger toward the substrate;

(c) transmitting a signal along a signal path;

(d) moving the first reflecting surface into the signal path to reflect a portion of the signal; and (e) detecting the reflected portion of the signal.

21. The method of claim 20, wherein the support member is coupled to a robot disposed in a chamber having a portion comprising a transparent material and wherein (c) comprises transmitting the signal through the transparent material from a source disposed in a region external to the chamber.

22. The method of claim 20, wherein (e) comprises detecting a reflected portion of the signal at a detector; and further comprising monitoring the output of the detector wherein the output is at a first state prior to (d) and at a second state during (e), wherein a change in the output from the first state to the second state is associated with a positional value of the clamp finger.

23. The method of claim 22, further comprising comparing the positional value with a calibrated positional value.

24. The method of claim 22, further comprising comparing the positional value with a calibrated positional value and further comprising:

(f) determining a position correction value by calculating a distance between the position of the clamp finger and a calibrated position of the clamp finger; and (g) adjusting a destination coordinate of the substrate according to the position correction value.

25. The method of claim 22, further comprising:

(f) moving a second reflecting surface into the signal path to reflect a portion of the signal, wherein the second reflecting surface is fixedly disposed on the support member; and (g) detecting the reflected portion of the signal.

26. The method of claim 25, further comprising:

(h) determining the distance between the first reflecting surface and the second reflecting surface.

* * * * *